US010222779B2

(12) United States Patent
Okabe et al.

(10) Patent No.: US 10,222,779 B2
(45) Date of Patent: Mar. 5, 2019

(54) SEMICONDUCTOR WAFER POSITION DISPLAY SYSTEM, SEMICONDUCTOR WAFER POSITION DISPLAY METHOD, AND SEMICONDUCTOR WAFER POSITION DISPLAY PROGRAM

(71) Applicant: Epicrew Corporation, Omura (JP)

(72) Inventors: Akira Okabe, Omura (JP); Masanori Tanoguchi, Omura (JP)

(73) Assignee: Epicrew Corporation (JP)

( * ) Notice: Subject to any disclaimer, the term of this patent is extended or adjusted under 35 U.S.C. 154(b) by 375 days.

(21) Appl. No.: 14/645,734

(22) Filed: Mar. 12, 2015

(65) Prior Publication Data

US 2015/0261203 A1 Sep. 17, 2015

(30) Foreign Application Priority Data

Mar. 13, 2014 (JP) .................................. 2014-049682

(51) Int. Cl.
*G06F 19/00* (2018.01)
*G05B 19/402* (2006.01)
(Continued)

(52) U.S. Cl.
CPC ....... *G05B 19/402* (2013.01); *G06F 3/04847* (2013.01); *H01L 21/67259* (2013.01);
(Continued)

(58) Field of Classification Search
CPC .................................................. G05B 19/402
(Continued)

(56) References Cited

U.S. PATENT DOCUMENTS 5,442,655 A * 8/1995 Dedic .................... H04L 25/06
329/353
9,543,223 B2 * 1/2017 Habets ................ G03F 7/70633
(Continued)

FOREIGN PATENT DOCUMENTS

JP   H09-129701 A1   5/1997
JP   2005-093678 A1  4/2005
JP   2010-199586 A1  9/2010

OTHER PUBLICATIONS

Akihiro Sato, Japanese Patent Office Action—Notice of Reasons for Rejection (re JP Patent Application 2014-049682), dated Oct. 14, 2014.

*Primary Examiner* — Mohammad Ali
*Assistant Examiner* — Sheela Rao
(74) *Attorney, Agent, or Firm* — DLA Piper LLP (US)

(57) ABSTRACT

A semiconductor wafer position display system, a semiconductor wafer position display method, and a semiconductor wafer position display program with which a deviation from an appropriate placement position of a semiconductor wafer mounted in a wafer mounting part can be displayed to a user in an easily understood manner are provided. The semiconductor wafer position display system includes: a data reception unit for receiving measurement data obtained by a semiconductor wafer position measurement device for measuring the deviation from the appropriate placement position of the semiconductor wafer mounted in the wafer mounting part; and a screen display control unit for controlling a display screen for visibly displaying the deviation from the appropriate placement position of the semiconductor wafer based on the measurement data received by the data reception unit, wherein the screen display control unit includes a circumference display screen control unit for presenting the deviation from the appropriate placement position of the semiconductor wafer by displaying a circumference of the (Continued)

semiconductor wafer based on the measurement data received by the data reception unit.

14 Claims, 8 Drawing Sheets

(51) Int. Cl.
  *H01L 21/67* (2006.01)
  *G06F 3/0484* (2013.01)
(52) U.S. Cl.
  CPC .............. *G05B 2219/31466* (2013.01); *G05B 2219/35491* (2013.01)
(58) Field of Classification Search
  USPC .............................. 29/407.09; 700/192, 195
  See application file for complete search history.

(56) References Cited

U.S. PATENT DOCUMENTS

| | | | | |
|---|---|---|---|---|
| 2003/0202178 | A1* | 10/2003 | Tsuji | .................. G01N 21/9503 356/237.2 |
| 2011/0155904 | A1* | 6/2011 | Hotta | .................. G03F 7/70466 250/307 |
| 2012/0216261 | A1 | 8/2012 | Holton | |

* cited by examiner

SEMICONDUCTOR WAFER POSITION DISPLAY SYSTEM, SEMICONDUCTOR WAFER POSITION DISPLAY METHOD, AND SEMICONDUCTOR WAFER POSITION DISPLAY PROGRAM

BACKGROUND OF THE INVENTION

Field of the Invention

The present invention relates to a semiconductor wafer position display system, a semiconductor wafer position display method, and a semiconductor wafer position display program. The present invention particularly relates to a semiconductor wafer position display system, a semiconductor wafer position display method, and a semiconductor wafer position display program for presenting a deviation from an appropriate placement position of a semiconductor wafer mounted in a wafer mounting part by displaying the circumference of the semiconductor wafer.

Background Art

A semiconductor manufacturing device applies high-temperature heat treatment or chemical vapor deposition to a semiconductor wafer to grow a crystal on the surface of the semiconductor wafer, thus generating a substrate. In this case, the semiconductor wafer is typically mounted on a mounting member called "susceptor".

The mounting member has a wafer mounting part called "pocket", and the semiconductor wafer is mounted in the wafer mounting part. During film formation, the mounting member is rotated to rotate the semiconductor wafer mounted on the mounting member, as a result of which a uniform crystal layer is formed on the entire surface of the semiconductor wafer. Here, the semiconductor wafer needs to be completely contained within the wafer mounting part during film formation.

Patent Document 1 discloses a technique of determining whether or not the position of a semiconductor wafer is appropriate by measuring the thermal radiation of the semiconductor wafer.

While such a technique of measuring a deviation from an appropriate placement position of a semiconductor wafer mounted in a wafer mounting part has been developed, a technique of displaying the detected deviation to the user in an easily understood manner needs to be developed, too.

[Patent Document 1] Japanese Patent Application Publication No. 2010-199586

SUMMARY OF THE INVENTION

The present invention has an object of providing a semiconductor wafer position display system, a semiconductor wafer position display method, and a semiconductor wafer position display program with which a deviation from an appropriate placement position of a semiconductor wafer mounted in a wafer mounting part can be displayed to a user in an easily understood manner.

A semiconductor wafer position display system according to the present invention is a semiconductor wafer position display system for displaying a deviation from an appropriate placement position of a semiconductor wafer mounted in a wafer mounting part, the semiconductor wafer position display system including a semiconductor wafer position display control device including: a data reception unit for receiving measurement data obtained by a semiconductor wafer position measurement device for measuring the deviation from the appropriate placement position of the semiconductor wafer mounted in the wafer mounting part; and a screen display control unit for controlling a display screen for visibly displaying the deviation from the appropriate placement position of the semiconductor wafer based on the measurement data received by the data reception unit, wherein the screen display control unit includes a circumference display screen control unit for presenting the deviation from the appropriate placement position of the semiconductor wafer by displaying a circumference of the semiconductor wafer based on the measurement data received by the data reception unit.

The circumference display screen control unit may present the deviation from the appropriate placement position of the semiconductor wafer by superimposing, on a circumference of the wafer mounting part, a measured circumference generated based on the measurement data.

The screen display control unit may further include a notch position display screen control unit for presenting the deviation from the appropriate placement position of the semiconductor wafer by displaying an angle of a notch position from a home position of the semiconductor wafer based on the measurement data received by the data reception unit.

The semiconductor wafer position display system may further include a measurement data analysis unit for analyzing the measurement data, wherein the measurement data analysis unit analyzes, from the measurement data, notch detection data obtained when detecting a notch of the semiconductor wafer, and wherein the circumference display screen control unit presents the deviation from the appropriate placement position of the semiconductor wafer by displaying the circumference of the semiconductor wafer based on the measurement data received by the data reception unit except the notch detection data.

The semiconductor wafer position display system may further include a measurement data analysis unit for analyzing the measurement data, wherein the measurement data analysis unit analyzes, from the measurement data, notch detection data obtained when detecting a notch of the semiconductor wafer and home position data indicating that a position of rotation of the wafer mounting part is a home position, and wherein the notch position display screen control unit presents the deviation from the appropriate placement position of the semiconductor wafer by displaying the angle of the notch position from the home position of the semiconductor wafer based on the notch detection data and the home position data.

The circumference display screen control unit may further display at least one of a maximum value and a minimum value of the deviation.

The circumference display screen control unit may further display at least one of: a position at which the deviation has a maximum value; and a position at which the deviation has a minimum value.

The semiconductor wafer position display system may further include a deviation determination unit for determining whether or not at least one of a maximum value and a minimum value of the deviation is within an acceptable range, wherein the screen display control unit further includes a determination result display screen control unit for displaying a result of the determination by the deviation determination unit.

The measurement data may be generated by the semiconductor wafer position measurement device analyzing a captured image of the wafer mounting part and the semiconductor wafer.

The data reception unit may further receive the image, and the screen display control unit may further include a real time display screen control unit for displaying in real time the image received by the data reception unit.

The screen display control unit may further include a statistical information display screen control unit for displaying the measurement data received by the data reception unit, as a graph in chronological order.

The screen display control unit may further display, as the deviation, the number of steps indicating movement in a rotation direction of an arm of a wafer transfer automatic robot in a semiconductor manufacturing device and the number of steps indicating movement in an extension direction of the arm of the wafer transfer automatic robot, on a circumference display screen displayed by the circumference display screen control unit.

A semiconductor wafer position display method according to the present invention causes a computer to perform: a data reception step of receiving measurement data obtained by a semiconductor wafer position measurement device for measuring the deviation from the appropriate placement position of the semiconductor wafer mounted in the wafer mounting part; and a screen display control step of controlling a display screen for visibly displaying the deviation from the appropriate placement position of the semiconductor wafer based on the measurement data received in the data reception step, wherein the screen display control step includes a circumference display screen control step of presenting the deviation from the appropriate placement position of the semiconductor wafer by displaying a circumference of the semiconductor wafer based on the measurement data received in the data reception step.

A semiconductor wafer position display program according to the present invention causes a computer to execute: a data reception function of receiving measurement data obtained by a semiconductor wafer position measurement device for measuring the deviation from the appropriate placement position of the semiconductor wafer mounted in the wafer mounting part; and a screen display control function of controlling a display screen for visibly displaying the deviation from the appropriate placement position of the semiconductor wafer based on the measurement data received by the data reception function, wherein the screen display control function includes a circumference display screen control function of presenting the deviation from the appropriate placement position of the semiconductor wafer by displaying a circumference of the semiconductor wafer based on the measurement data received by the data reception function.

With a semiconductor wafer position display system, a semiconductor wafer position display method, and a semiconductor wafer position display program according to the present invention, a deviation from an appropriate placement position of a semiconductor wafer mounted in a wafer mounting part can be displayed to a user in an easily understood manner.

DESCRIPTION OF THE PREFERRED EMBODIMENTS

An embodiment of a semiconductor wafer position display system according to the present invention is described in detail below, with reference to drawings.

(Overview of Semiconductor Wafer Position Display System)

Figure 1:
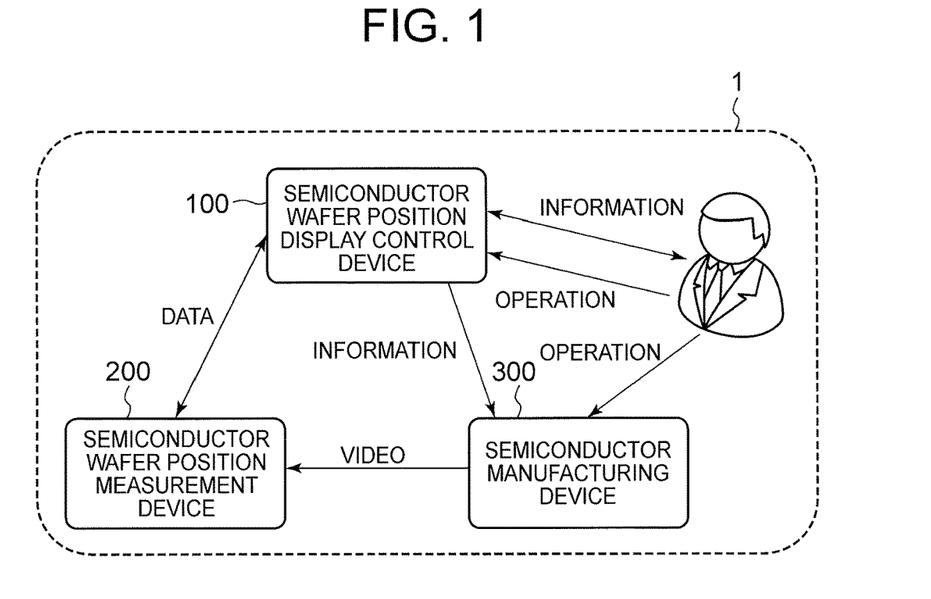
FIG. 1 is a schematic diagram showing an overview of a semiconductor wafer position display system according to an embodiment of the present invention.

FIG. 1 is a schematic diagram showing an overview of a semiconductor wafer position display system 1 according to the embodiment of the present invention.

As shown in FIG. 1, the semiconductor wafer position display system according to the embodiment of the present invention is a semiconductor wafer position display system 1 for displaying a deviation from an appropriate placement position of a semiconductor wafer mounted in a wafer mounting part, and includes a semiconductor wafer position display control device 100. Though this embodiment describes the case where the semiconductor wafer position display system 1 further includes a semiconductor wafer position measurement device 200 and a semiconductor manufacturing device 300, the present invention is not limited to such.

(Details of Semiconductor Wafer Position Display Control Device 100)

Figure 2:
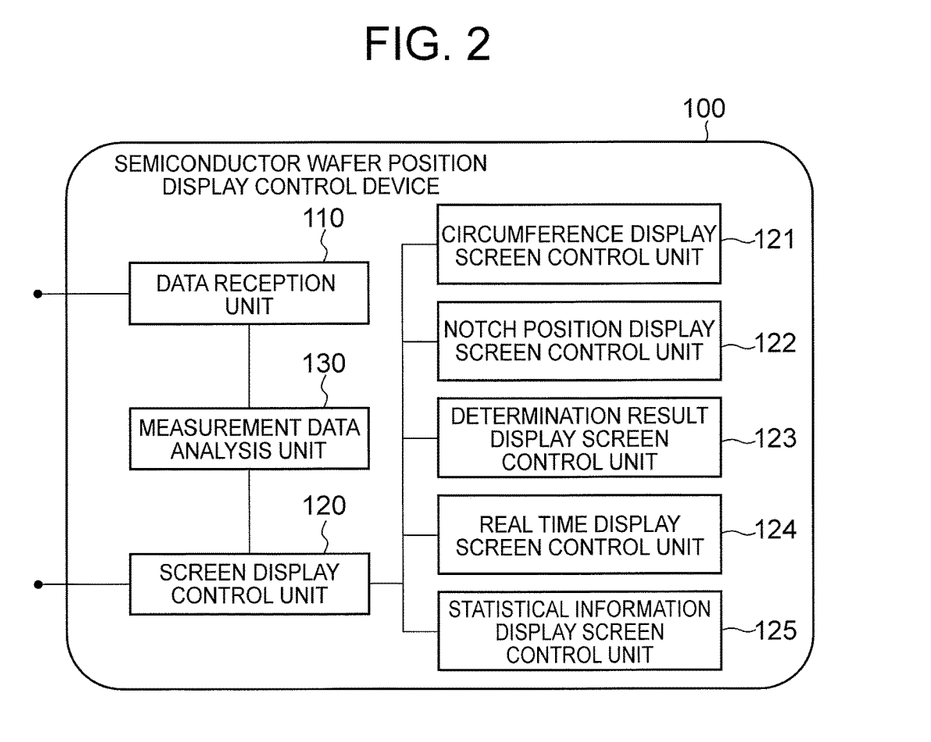
FIG. 2 is a block diagram showing an example of the detailed functional structure of a semiconductor wafer position display control device according to the embodiment of the present invention.

FIG. 2 is a block diagram showing an example of the detailed functional structure of the semiconductor wafer position display control device 100.

As shown in FIG. 2, the semiconductor wafer position display control device 100 includes a data reception unit 110 and a screen display control unit 120.

The data reception unit 110 receives measurement data obtained by the semiconductor wafer position measurement device 200 for measuring the deviation from the appropriate placement position of the semiconductor wafer mounted in the wafer mounting part. The semiconductor wafer position measurement device 200 will be described in detail later.

The screen display control unit 120 controls a display screen for visibly displaying the deviation from the appropriate placement position of the semiconductor wafer, based on the measurement data received by the data reception unit 110.

In the semiconductor wafer position display system 1 according to the present invention, the screen display control unit 120 includes a circumference display screen control unit 121 for presenting the deviation from the appropriate placement position of the semiconductor wafer by displaying the circumference of the semiconductor wafer based on the measurement data received by the data reception unit 110. With such a structure, the deviation from the appropriate placement position of the semiconductor wafer mounted in the wafer mounting part can be displayed to the user in an easily understood manner.

The circumference display screen control unit 121 may present the deviation from the appropriate placement position of the semiconductor wafer by superimposing, on the circumference of the wafer mounting part, a measured circumference generated based on the measurement data. With such a structure, the deviation from the appropriate placement position of the semiconductor wafer mounted in the wafer mounting part can be displayed to the user in a more easily understood manner.

The screen display control unit 120 may further include a notch position display screen control unit 122 for presenting the deviation from the appropriate placement position of the semiconductor wafer by displaying the notch position and home position of the semiconductor wafer based on the measurement data received by the data reception unit 110. With such a structure, the deviation from the appropriate placement position of the semiconductor wafer mounted in the wafer mounting part can be displayed to the user in a more easily understood manner.

The semiconductor wafer position display control device 100 may further include a measurement data analysis unit 130 for analyzing the measurement data received by the data reception unit 110.

The measurement data analysis unit 130 may analyze, from the measurement data, notch detection data obtained when detecting the notch of the semiconductor wafer. The circumference display screen control unit 121 may present the deviation from the appropriate placement position of the semiconductor wafer by displaying the circumference of the semiconductor wafer based on the measurement data received by the data reception unit 110 except the notch detection data. With such a structure, the circumference of the semiconductor wafer can be displayed more accurately.

Alternatively, the measurement data analysis unit 130 may analyze, from the measurement data, notch detection data obtained when detecting the notch of the semiconductor wafer and home position data indicating that the position of rotation of the wafer mounting part is a home position. The notch position display screen control unit 122 may present the deviation from the appropriate placement position of the semiconductor wafer by displaying the notch position and home position of the semiconductor wafer based on the notch detection data and the home position data. With such a structure, the deviation of the notch position can be displayed more accurately.

The notch position and the home position are, for example, displayed as lines, and their angle may be displayed simultaneously. This will be described in detail later. The notch position and the home position may be switched from display to non-display by setting. The display of the notch position may be suppressed in the case where the notch position is not properly detected.

The circumference display screen control unit 121 may further display the maximum value and/or the minimum value of the deviation. With such a structure, the extent of deviation from the appropriate placement position of the semiconductor wafer mounted in the wafer mounting part can be displayed to the user in a more easily understood manner.

The circumference display screen control unit 121 may further display the position at which the deviation has the maximum value and/or the position at which the deviation has the minimum value. With such a structure, the position at which the extent of deviation from the appropriate placement position of the semiconductor wafer mounted in the wafer mounting part is large and the position at which the extent of deviation is small can be displayed to the user in a more easily understood manner.

Preferably, the measurement data analysis unit 130 further determines whether or not the maximum value and/or the minimum value of the deviation is within an acceptable range, and the screen display control unit 120 further includes a determination result display screen control unit 123 for displaying a result of the determination. With such a structure, the extent of deviation from the appropriate placement position of the semiconductor wafer mounted in the wafer mounting part can be displayed to the user in a more easily understood manner.

The measurement data may be generated by the semiconductor wafer position measurement device 200 analyzing a captured image of the wafer mounting part and the semiconductor wafer. This will be described in detail later, in the detailed description of the semiconductor wafer position measurement device 200.

The data reception unit 110 may further receive the image, and the screen display control unit 120 may further include a real time display screen control unit 124 for displaying in real time the image received by the data reception unit 110.

The screen display control unit 120 may further include a statistical information display screen control unit 125 for displaying the measurement data received by the data reception unit 110, as a graph in chronological order.

(Details of Semiconductor Wafer Position Measurement Device 200)

Figure 3:
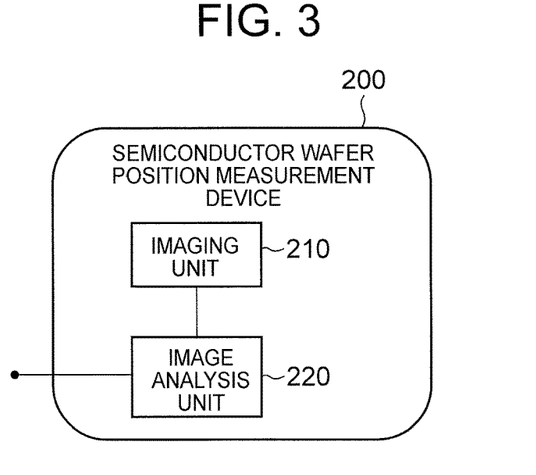
FIG. 3 is a block diagram showing an example of the functional structure of a semiconductor wafer position measurement device according to the embodiment of the present invention.

FIG. 3 is a block diagram showing an example of the functional structure of the semiconductor wafer position measurement device 200.

As shown in FIG. 3, the semiconductor wafer position measurement device 200 may include an imaging unit 210 and an image analysis unit 220.

The imaging unit 210 is placed in the semiconductor manufacturing device 300, and captures an image of the semiconductor wafer and the wafer mounting part.

The image analysis unit 220 analyzes the deviation from the appropriate placement position of the semiconductor wafer, based on the image captured by the imaging unit 210.

Figure 4A:
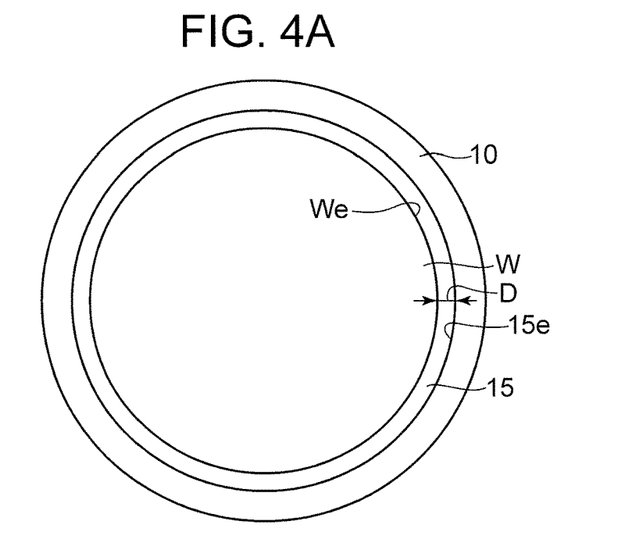
FIG. 4A is a schematic diagram for describing deviation analysis by the semiconductor wafer position measurement device according to the embodiment of the present invention.
Figure 4B:
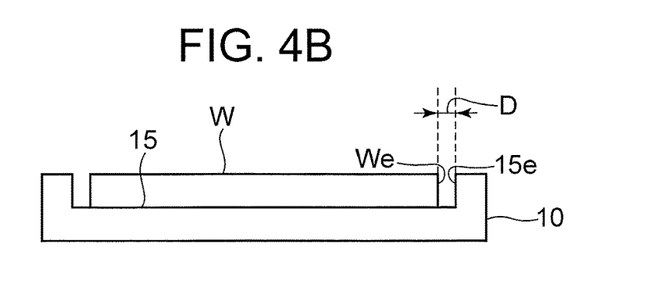
FIG. 4B is a schematic diagram for describing deviation analysis by the semiconductor wafer position measurement device according to the embodiment of the present invention.

In detail, as shown in FIGS. 4A and 4B, an image of a rotating semiconductor wafer W and a wafer mounting part 15 of a rotating mounting member 10 may be continuously captured at a predetermined position, to continuously measure a distance D between an edge We of the semiconductor wafer W and a side wall 15e of the wafer mounting part 15.

(Details of Circumference Display Screen Control Unit 121)

Figure 5:
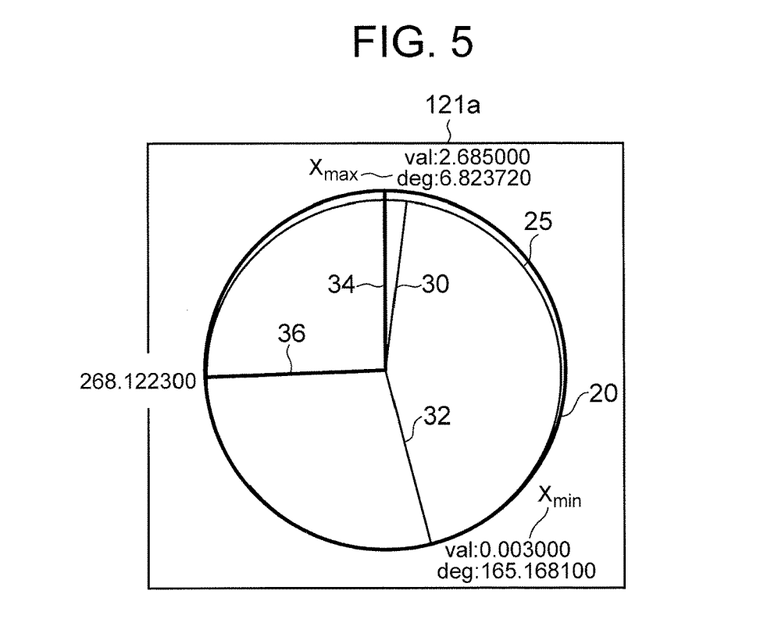
FIG. 5 is a schematic diagram showing an example of a circumference display screen displayed by a circumference display screen control unit.

FIG. 5 shows an example of a circumference display screen 121a displayed by the circumference display screen control unit 121.

As shown in FIG. 5, the deviation from the appropriate placement position of the semiconductor wafer may be presented by superimposing, on a circumference 20 of the wafer mounting part, a measured circumference 25 generated based on the measurement data, on the circumference display screen 121a.

A maximum value $X_{max}$ and/or a minimum value $X_{min}$ of the deviation may also be displayed on the circumference display screen 121a. In the illustrated example, the maximum value $X_{max}$ is 2.685000 mm, the minimum value $X_{min}$ is 0.003000 mm, and the angles of the respective deviation parts from the home position are 6.823720 degrees and 165.168100 degrees.

The position at which the deviation has a maximum value and/or the position at which the deviation has a minimum value may also be displayed on the circumference display screen 121a. In the illustrated example, the respective positions are displayed as lines 30 and 32.

Moreover, on the circumference display screen 121a, the home position is displayed as a line 34, the notch position is displayed as a line 36, and the angle from the home position is displayed as 268.122300 degrees near the notch position.

(Details of Real Time Display Screen Control Unit 124)

Figure 6:
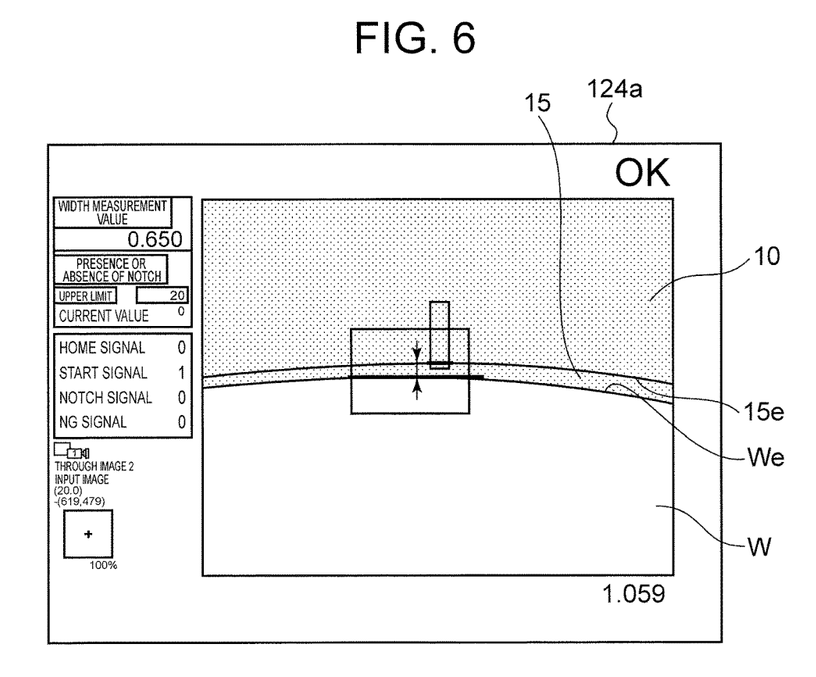
FIG. 6 is a schematic diagram showing an example of a real time display screen displayed by a real time display screen control unit.

FIG. 6 shows an example of a real time display screen 124a displayed by the real time display screen control unit 124.

As shown in FIG. 6, the image received by the data reception unit 110 may be displayed in real time on the real time display screen 124a. This image may be the same as the image captured by the imaging unit 210. The image may be displayed using an ActiveX® control technology.

(Details of Statistical Information Display Screen Control Unit 125)

Figure 7:
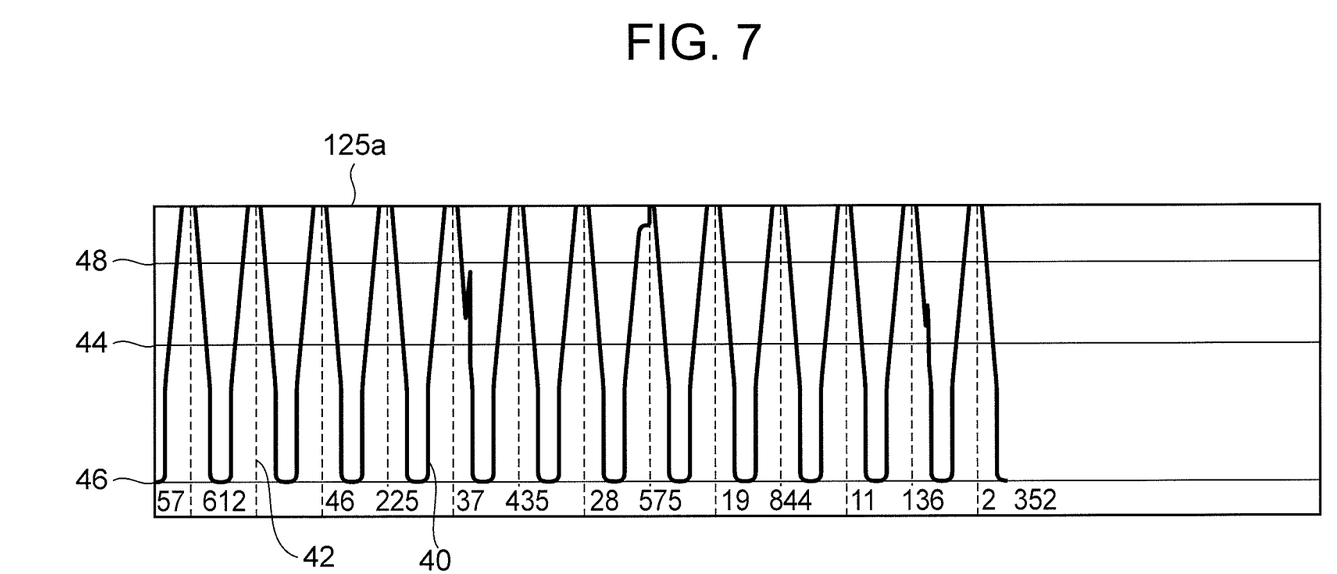
FIG. 7 is a schematic diagram showing an example of a statistical information display screen displayed by a statistical information display screen control unit.

FIG. 7 shows an example of a statistical information display screen 125a displayed by the statistical information display screen control unit 125.

As shown in FIG. 7, the measurement data received by the data reception unit 110 may be displayed as a graph 40 in chronological order on the statistical information display screen 125a.

Preferably, a vertical line 42 is displayed at the position of a home signal on the statistical information display screen 125a.

Preferably, the time is displayed below the home signal on the statistical information display screen 125a, without overlapping with the other display elements.

Preferably, an upper threshold and lower threshold of the acceptable range of the deviation and a median as an ideal value are displayed as lines on the statistical information display screen 125a. In FIG. 7, the medium is indicated by a line 44, the lower threshold by a line 46, and the upper threshold by a line 48.

Preferably, new data is displayed leftmost on the statistical information display screen 125a, with the display on the screen moving rightward.

The statistical information display screen 125a may be scrolled on the time axis using a horizontal scrollbar, and its time scale may be changed using a slider.

(Details of Display Screen)

Figure 8:
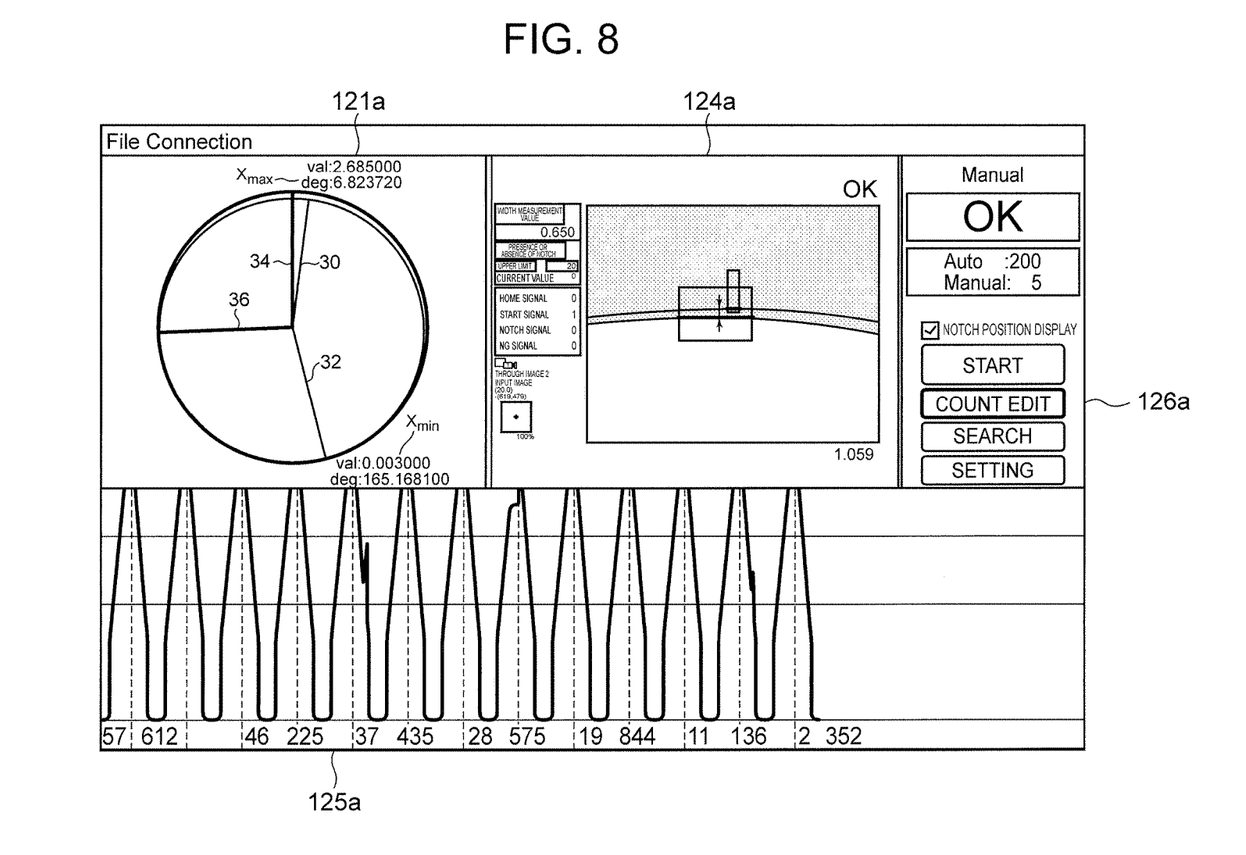
FIG. 8 is a schematic diagram showing an example of a display screen in which the circumference display screen, the real time display screen, and the statistical information display screen are displayed simultaneously.

FIG. 8 shows an example of a display screen in which the above-mentioned circumference display screen 121a, real time display screen 124a, and statistical information display screen 125a are displayed simultaneously. Note that the display screen only needs to include at least one of the above-mentioned display screens.

As shown in FIG. 8, the screen display control unit 120 according to the present invention may further include a console display screen control unit (not shown) for displaying a console display screen 126a.

(Details of Console Display Screen)

Figure 9:
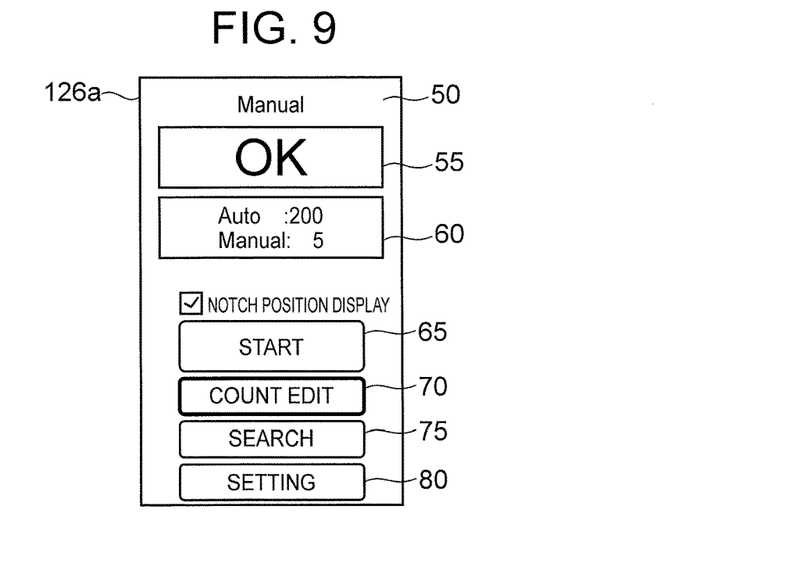
FIG. 9 is a schematic diagram showing an example of a console display screen displayed by a console display screen control unit.

FIG. 9 shows an example of the console display screen 126a displayed by the console display screen control unit.

As shown in FIG. 9, the console display screen 126a may include not only a mode display 50, a determination result display 55, an information display 60, etc., but also a start/stop button 65, a processing count edit button 70, a search button 75, a setting button 80, etc.

The mode display 50 designates any of automatic mode, manual mode, and calibration mode.

The determination result display 55 shows a determination result by the determination result display screen control unit 123. In detail, the determination result display 55 shows "NG" or the like in the case where the deviation is less than the lower threshold of the acceptable range of the deviation set beforehand, in the case where the deviation is greater than the upper threshold of the acceptable range, in the case where the number of values exceeding any of the thresholds in data corresponding to one round is greater than a set ratio, and in the case where there is unmeasurable data, and otherwise shows "OK" or the like.

The information display 60 shows a processing count in each of automatic mode and manual mode, and an EXT/ROT value as arm position in calibration mode.

The start/stop button 65 shows a start button during stop, and a stop button during measurement. When the stop button is pressed, a stop confirmation screen is displayed.

When the processing count edit button 70 is pressed, a processing count edit screen is displayed. The number of wafers processed can be changed on the displayed screen. This button is disabled during measurement.

When the search button 75 is pressed, a search setting screen is displayed. The start and end dates for files to be searched for can be selected on the displayed screen. As the selection method, for example, a calendar is displayed and a predetermined date is selected from the displayed calendar. A list of filenames found as a result of the search may be displayed on a search result screen. When a specific file is selected from the list, a process is performed according to the file. This button is disabled during measurement. Files to be searched for include a display screen image file and a CSV file in which the corresponding data is recorded.

When the setting button is pressed, a setting screen is displayed. Mode setting, wafer size setting, threshold setting, NG signal transmission ON/OFF setting, CSV storage setting, CSV storage directory setting, storage mode setting, home position alignment value setting, trigger interval setting, camera position setting, notch width setting, notch height setting, frequency error acceptable range setting, etc. can be performed on this screen. The setting screen may be configured so that tabs are used to switch between the above-mentioned setting screens. This button is disabled during measurement.

The mode setting allows setting of the operation mode to any of automatic mode, manual mode, and calibration mode.

The wafer size setting allows setting of the wafer size. Examples of the wafer size include 200 mm and 300 mm.

The threshold setting allows setting of the minimum value and the maximum value corresponding to the above-mentioned "OK", and also allows setting of the threshold of the ratio of "NG" values.

The NG signal transmission ON/OFF setting allows setting of whether or not to transmit a signal to the device in the case of NG.

The CSV storage setting allows setting of whether or not to store a CSV file.

The CSV storage directory setting allows setting of a directory in which the CSV file is stored. A storage folder in All/NG in each of automatic mode and manual mode is generated in the directory.

The storage mode setting allows setting of the storage unit of measurement data. For example, only a minimum unit of measurement data may be stored instead of storing all measurement data. The minimum unit corresponds to one round from first home position data to the next home position data.

The home position alignment value setting allows setting of an actual deviation of the home position.

The trigger interval setting allows setting of a trigger interval in a controller. The time of data is calculated based on this interval in the present invention.

The camera position setting allows setting of an offset of the position of a camera which is the imaging device of the semiconductor wafer position measurement device, as an angle.

The notch width setting allows setting of the notch width. The notch width is used in notch removal.

The notch height setting allows setting of the notch height. The notch height is used in notch determination.

The frequency error acceptable range setting allows setting of a threshold for NG in the case where the rotation time of the susceptor has variation.

(Details of Analysis Function)

The measurement data analysis unit 130 may analyze, from the measurement data, the notch detection data obtained when detecting the notch of the semiconductor wafer and/or the home position data indicating that the position of rotation of the wafer mounting part is the home position.

The measurement data analysis unit 130 may determine whether or not the maximum value and/or the minimum value of the deviation is within the acceptable range, based on the measurement data received by the data reception unit 110 except the notch detection data.

(Calibration Function)

With the calibration function, the value of ROT (movement in arm rotation direction)/EXT (movement in arm extension direction) can be calculated from the deviation from the center of the wafer to generate averaged circumference data.

In the semiconductor wafer position display system 1 according to the present invention, the position information of the wafer in the chamber of the semiconductor manufacturing device 300 can be obtained with high accuracy. By reflecting the position information in a wafer transfer automatic robot of the semiconductor manufacturing device 300, the wafer transfer position can be adjusted/set more accurately than in conventional systems.

Figure 10:
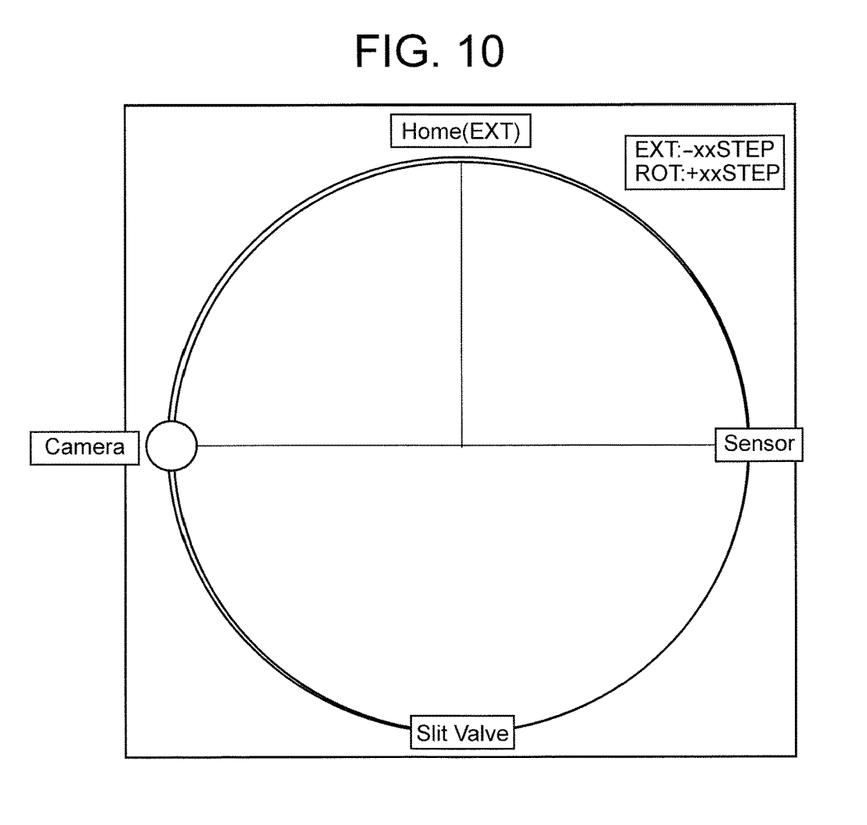
FIG. 10 is a schematic diagram showing another example of the circumference display screen displayed by the circumference display screen control unit.

FIG. 10 shows another example of the circumference display screen 121a displayed by the circumference display screen control unit 121.

As shown in FIG. 10, the circumference of the wafer mounting part and the measured circumference may be displayed in a superimposed manner on the circumference display screen. Moreover, in this example, the location corresponding to the home position is indicated as "Home (EXT)", and the location corresponding to the slit valve position is indicated as "Slit Valve". Here, the location corresponding to the home position is at 12 o'clock.

The circled imaging range by the imaging unit is also shown in FIG. 10. The angle between the home position and the imaging unit may be displayed, too.

The sensor position is also shown in FIG. 10. The angle between the home position and the sensor may be displayed, too.

The screen display control unit 120 may further display, as the deviation, the number of steps indicating the movement in the rotation direction of the arm of the wafer transfer automatic robot in the semiconductor manufacturing device and the number of steps indicating the movement in the extension direction of the arm of the wafer transfer automatic robot, on the circumference display screen 121a displayed by the circumference display screen control unit 121.

An embodiment of a semiconductor wafer position display method according to the present invention is described below, with reference to drawings.

Figure 11:
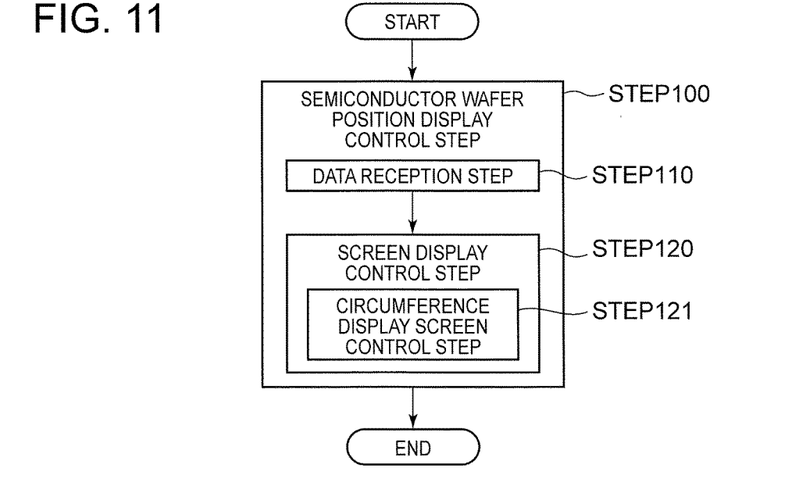
FIG. 11 is a flowchart showing a semiconductor wafer position display method according to the embodiment of the present invention.

As shown in FIG. 11, the semiconductor wafer position display method according to the present invention is a semiconductor wafer position display method for displaying a deviation from an appropriate placement position of a semiconductor wafer mounted in a wafer mounting part, the semiconductor wafer position display method causing a computer to perform a semiconductor wafer position display control step (STEP 100) including a data reception step (STEP 110) and a screen display control step (STEP 120). The screen display control step (STEP 120) includes a circumference display screen control step (STEP 121) for presenting the deviation from the appropriate placement position of the semiconductor wafer by displaying a circumference of the semiconductor wafer based on measurement data received in the data reception step (STEP 110).

In the data reception step (STEP 110), the measurement data obtained by a semiconductor wafer position measurement device for measuring the deviation from the appropriate placement position of the semiconductor wafer mounted in the wafer mounting part is received. This step can be performed by the above-mentioned data reception unit 110. The details have been described above.

In the screen display control step (STEP 120), a display screen displayed by a display unit is controlled based on the measurement data received in the data reception step. This step can be performed by the above-mentioned screen display control unit 120. The details have been described above.

Lastly, an embodiment of a semiconductor wafer position display program according to the present invention is described below.

The semiconductor wafer position display program according to the present invention is a semiconductor wafer position display program for displaying a deviation from an appropriate placement position of a semiconductor wafer mounted in a wafer mounting part, the semiconductor wafer position display program causing a computer to execute a semiconductor wafer position display control function including: a data reception function of receiving measurement data obtained by a semiconductor wafer position measurement device for measuring the deviation from the appropriate placement position of the semiconductor wafer mounted in the wafer mounting part; and a screen display control function of controlling a display screen for visibly displaying the deviation from the appropriate placement position of the semiconductor wafer based on the measurement data received by the data reception function, wherein the screen display control function includes a circumference display screen control function of presenting the deviation from the appropriate placement position of the semiconductor wafer by displaying a circumference of the semiconductor wafer based on the measurement data received by the data reception function.

The data reception function can be executed by the above-mentioned data reception unit 110. The details have been described above.

The screen display control function can be executed by the above-mentioned screen display control unit 120. The details have been described above.

The semiconductor wafer position display program may be stored in a computer-readable storage medium and provided. The storage medium is not particularly limited so long as it is computer-readable, such as a CD-ROM or a DVD.

(External Data Flow)

FIGS. 12A, 12B, 12C, 13A and 13B are each a schematic diagram for describing an example of data flow in the semiconductor wafer position display system 1 according to the present invention.

(Data Reception)

Figure 12A:
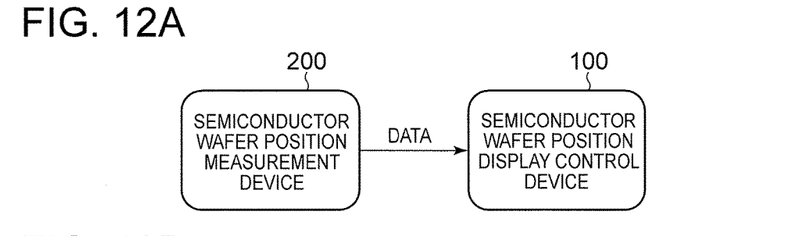
FIG. 12A is a schematic diagram showing the flow of external data in the semiconductor wafer position display method according to the embodiment of the present invention.

As shown in FIG. 12A, the semiconductor wafer position display control device 100 according to the present invention receives data as a result of processing by the semiconductor wafer position measurement device 200, at trigger intervals.

(Start Data)

Figure 12B:
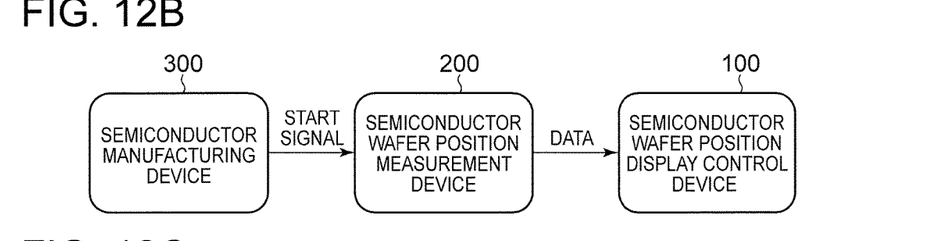
FIG. 12B is a schematic diagram showing the flow of external data in the semiconductor wafer position display method according to the embodiment of the present invention.

As shown in FIG. 12B, having received a start signal indicating a gas blowing state of a wafer from the semiconductor manufacturing device 300, the semiconductor wafer position measurement device 200 stores the presence or absence of the start signal in data with a value of 0 to 1, and transmits the data to the semiconductor wafer position display control device 100. This data is set as start data. The N-th value of the data is 1 from when the blowing starts to when the blowing stops.

(Home Position Data)

Figure 12C:
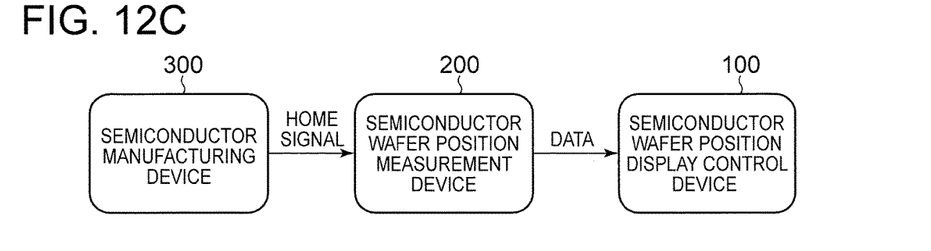
FIG. 12C is a schematic diagram showing the flow of external data in the semiconductor wafer position display method according to the embodiment of the present invention.

As shown in FIG. 12C, the semiconductor manufacturing device 300 transmits a home signal indicating that the position of rotation of the susceptor is the home position, to the semiconductor wafer position measurement device 200. The semiconductor wafer position measurement device 200 stores the presence or absence of the home signal in data with a value of 0 to 1, and transmits the data to the semiconductor wafer position display control device 100. A plurality of successive home signals might be included for one home position. The successive home signals are processed by filtering in the semiconductor wafer position display control device 100.

(NG Signal)

Figure 13A:
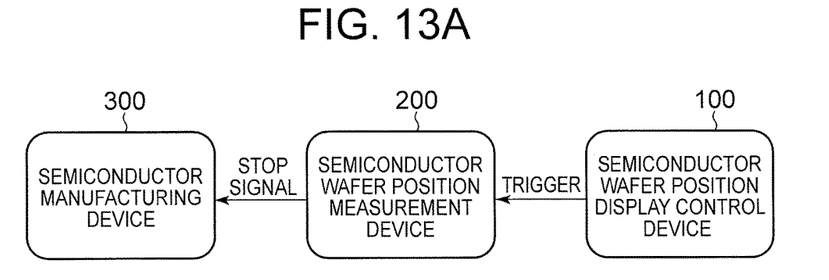
FIG. 13A is a schematic diagram showing the flow of external data in the semiconductor wafer position display method according to the embodiment of the present invention.

As shown in FIG. 13A, an NG signal transmitted from the semiconductor wafer position display control device 100 upon NG detection is delivered to the semiconductor manufacturing device 300.

(Notch Detection Data)

Figure 13B:
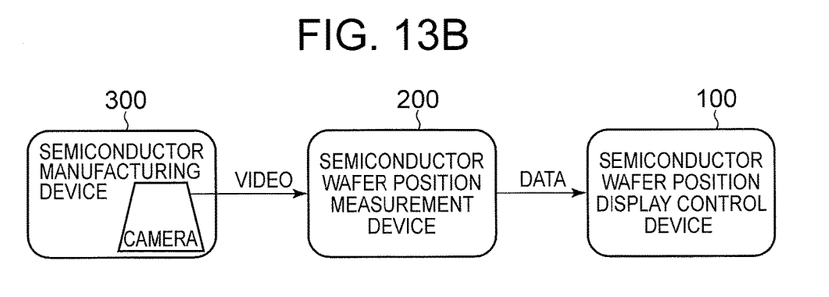
FIG. 13B is a schematic diagram showing the flow of external data in the semiconductor wafer position display method according to the embodiment of the present invention.

The semiconductor wafer position measurement device 200 analyzes the presence or absence of a notch from a camera image, stores the presence or absence in data with a value of 0 to 1, and transmits the data to the semiconductor wafer position display control device 100.

Though the embodiment of the present invention has been described above, the scope of the invention defined in the claims should not be limited to the foregoing embodiment. Besides, not all of the combination of features described in the embodiment are necessarily essential to the problem solving means of the present invention.

DESCRIPTION OF REFERENCE SIGNS

1 semiconductor wafer position display system
100 semiconductor wafer position display control device
110 data reception unit
120 screen display control unit
121 circumference display screen control unit
122 notch position display screen control unit
123 determination result display screen control unit
124 real time display screen control unit
125 statistical information display screen control unit
130 measurement data analysis unit
200 semiconductor wafer position measurement device
210 imaging unit
220 image analysis unit
300 semiconductor manufacturing device

What is claimed is:

1. A semiconductor wafer position display system for displaying a deviation from an appropriate placement position of a semiconductor wafer mounted in a wafer mounting part having a circular interior side wall, the semiconductor wafer position display system comprising:

a semiconductor wafer position measurement device for measuring the deviation from the appropriate placement position of the semiconductor wafer mounted in the wafer mounting part; and a semiconductor wafer position display control device comprising a computer, the computer serving as a data reception unit for receiving measurement data obtained by the semiconductor wafer position measurement device for measuring the deviation from the appropriate placement position of the semiconductor wafer mounted in the wafer mounting part and storing the measurement data;

a screen display control unit for controlling a display screen for visibly displaying the deviation from the appropriate placement position of the semiconductor wafer based on the measurement data received by the data reception unit, and a measurement data analysis unit for analyzing the measurement data received by the data reception unit, wherein the screen display control unit includes a circumference display screen control unit for generating display information, based on the measurement data stored in the computer, which presents the deviation from the appropriate placement position of the semiconductor wafer by displaying a circumference of the semiconductor wafer and a circumference of the circular interior side wall of the wafer mounting part, and the measurement data analysis unit analyzes, from the measurement data, notch detection data obtained when detecting a notch of the semiconductor wafer, and the circumference display screen control unit presents the deviation from the appropriate placement position of the semiconductor wafer by displaying the circumference of the semiconductor wafer based on the measurement data received by the data reception unit except the notch detection data.

2. The semiconductor wafer position display system according to claim 1, wherein the circumference display screen control unit presents the deviation from the appropriate placement position of the semiconductor wafer by superimposing, on a circumference of the wafer mounting part, a measured circumference generated based on the measurement data.

3. The semiconductor wafer position display system according to claim 1, wherein the screen display control unit further includes a notch position display screen control unit for presenting the deviation from the appropriate placement position of the semiconductor wafer by displaying a notch position and a home position of the semiconductor wafer based on the measurement data received by the data reception unit.

4. The semiconductor wafer position display system according to claim 3, wherein the semiconductor wafer position display control device further includes a measurement data analysis unit for analyzing the measurement data received by the data reception unit, wherein the measurement data analysis unit analyzes, from the measurement data, notch detection data obtained when detecting a notch of the semiconductor wafer and home position data indicating that a position of rotation of the wafer mounting part is a home position, and wherein the notch position display screen control unit presents the deviation from the appropriate placement position of the semiconductor wafer by displaying the notch position and the home position of the semiconductor wafer based on the notch detection data and the home position data.

5. The semiconductor wafer position display system according to claim 1, wherein the measurement data analysis unit further determines whether or not at least one of a maximum value and a minimum value of the deviation is within an acceptable range, and wherein the screen display control unit further includes a determination result display screen control unit for displaying a result of the determination.

6. The semiconductor wafer position display system according to claim 1, wherein the circumference display screen control unit further displays at least one of a maximum value and a minimum value of the deviation.

7. The semiconductor wafer position display system according to claim 1, wherein the circumference display screen control unit further displays at least one of: a position at which the deviation has a maximum value; and a position at which the deviation has a minimum value.

8. The semiconductor wafer position display system according to claim 1, wherein the measurement data is generated by the semiconductor wafer position measurement device analyzing a captured image of the wafer mounting part and the semiconductor wafer.

9. The semiconductor wafer position display system according to claim 8, wherein the data reception unit further receives the image, and wherein the screen display control unit further includes a real time display screen control unit for displaying in real time the image received by the data reception unit.

10. The semiconductor wafer position display system according to claim 1, wherein the screen display control unit further includes a statistical information display screen control unit for displaying the measurement data received by the data reception unit, as a graph in chronological order.

11. The semiconductor wafer position display system according to claim 1, wherein the screen display control unit for controlling the display screen for visibly displaying the deviation from the appropriate placement position of the semiconductor wafer based on the measured data received by the data reception unit further controls the display screen for visibly displaying the deviation, as a number of steps indicating movement in a rotation direction of an arm of a wafer transfer automatic robot in a semiconductor manufacturing device and as a number of steps indicating movement in an extension direction of the arm of the wafer transfer automatic robot, on a circumference display screen displayed by the circumference display screen control unit.

12. A semiconductor wafer position display method for displaying a deviation from an appropriate placement position of a semiconductor wafer mounted in a wafer mounting part having a circular interior side wall, the semiconductor wafer position display method causing a computer to perform:

a semiconductor wafer position measurement step including measuring, by a semiconductor wafer position measurement device, the deviation from the appropriate placement position of the semiconductor wafer mounted in the wafer mounting part; and a semiconductor wafer position display control step, performed by a semiconductor wafer position display control device, including:

a data reception step of receiving and storing measurement data obtained by the semiconductor wafer position measurement device for measuring the deviation from the appropriate placement position of the semiconductor wafer mounted in the wafer mounting part; and a screen display control step of controlling a display screen for visibly displaying the deviation from the appropriate placement position of the semiconductor wafer based on the measurement data received in the data reception step, a measurement data analysis step, performed by analyzing, from the measurement data, notch detection data obtained when detecting a notch of the semiconductor wafer, wherein the screen display control step includes a circumference display screen control step of generating display information, based on the stored measurement data, which presents the deviation from the appropriate placement position of the semiconductor wafer by displaying a circumference of the semiconductor wafer and a circumference of the circular interior side wall of the wafer mounting part and presents the deviation from the appropriate placement position of the semiconductor wafer by displaying the circumference of the semiconductor wafer based on the measurement data received by the data reception unit except the notch detection data.

13. A non-transitory computer-readable storage medium storing a semiconductor wafer position display program for displaying a deviation from an appropriate placement position of a semiconductor wafer mounted in a wafer mounting part having a circular interior side wall, the semiconductor wafer position display program causing a computer to execute:
  a semiconductor wafer position measurement step including measuring the deviation from the appropriate placement position of the semiconductor wafer mounted in the wafer mounting part; and
  a semiconductor wafer position display control function including:
    a data reception function of receiving and storing measurement data of the deviation from the appropriate placement position of the semiconductor wafer mounted in the wafer mounting part; and
    a screen display control function of controlling a display screen for visibly displaying the deviation from the appropriate placement position of the semiconductor wafer based on the measurement data received by the data reception function,
  a measurement data analysis step, performed by analyzing, from the measurement data, notch detection data obtained when detecting a notch of the semiconductor wafer,
  wherein the screen display control function includes a circumference display screen control function of generating display information, based on the stored measurement data, which presents the deviation from the appropriate placement position of the semiconductor wafer by displaying a circumference of the semiconductor wafer and a circumference of the circular interior side wall of the wafer mounting part and presents the deviation from the appropriate placement position of the semiconductor wafer by displaying the circumference of the semiconductor wafer based on the measurement data received by the data reception unit except the notch detection data.

14. The semiconductor wafer position display system according to claim 1, wherein the measurement data is obtained by measuring a distance between the circumference of the semiconductor wafer and the circumference of the circular interior side wall of the wafer mounting part from an image obtained by repeatedly capturing a rotating state of the wafer mounting part having the semiconductor wafer mounted in the wafer mounting part where the measuring is performed at a predetermined position of each repeatedly captured image.

* * * * *